United States Patent [19]

Kloek et al.

[11] 3,858,306

[45] Jan. 7, 1975

[54] ALLOY JUNCTIONS IN MERCURY CADMIUM TELLURIDE

[75] Inventors: Arvid E. Kloek, Minneapolis; Myrsyl Walter Scott, Minnetonka, both of Minn.

[73] Assignee: Honeywell Inc., Minneapolis, Minn.

[22] Filed: Aug. 5, 1971

[21] Appl. No.: 169,572

[52] U.S. Cl. .................... 29/572, 29/589, 148/171, 148/172, 148/177, 148/185

[51] Int. Cl. .................... H01l 15/02

[58] Field of Search .......... 148/177, 179, 181, 185, 148/171, 172, 1.5; 29/572, 589

[56] References Cited

UNITED STATES PATENTS 3,459,603 8/1969 Weisberg et al. .................. 148/1.5

3,723,190 3/1973 Kruse et al. ....................... 148/1.5

*Primary Examiner*—Richard O. Dean

*Attorney, Agent, or Firm*—David R. Fairbairn

[57] ABSTACT

PN junctions are formed in a P type body of mercury cadmium telluride by heating an indium body to form hot indium, which is then deposited on a surface of the P type body. The hot indium is believed to cause localized heating of the P type body which is sufficient for the formation of an alloy junction, but insufficient for the complete displacement of mercury within the alloy junction.

6 Claims, 1 Drawing Figure

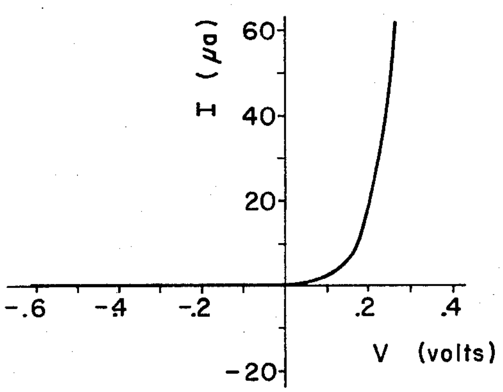
INVENTORS
ARVID E. KLOEK
MYRSYL WALTER SCOTT
BY
Osmund R. Dahle
ATTORNEY.

ALLOY JUNCTIONS IN MERCURY CADMIUM TELLURIDE

REFERENCE TO RELATED PATENT APPLICATIONS

Reference should be made to co-pending patent application Ser. No. 169,566 entitled "Alloy Junctions in Mercury Cadmium Telluride" by Donald A. Soderman, which was filed on an even date herewith and which is assigned to the same assignee as the present invention.

BACKGROUND OF THE INVENTION

The development of solid state detectors of wavelengths within the infrared portion of the electromagnetic spectrum has led to the use of semiconductor alloys having the proper energy gap for intrinsic photoconductivity at wavelengths within the range of 1 to 30 microns. One successful intrinsic detector material that has been developed for the photoconductive detectors is mercury cadmium telluride ($Hg_{1-x}Cd_xTe$), a semiconductor material which is an alloy of a semi-metal, mercury telluride, and a semiconductor, cadmium telluride. The mole ratio, X, of cadmium telluride in the alloy determines the energy gap and therefore the optical and semiconducting properties of the alloy.

It is highly desirable to form PN junctions in mercury cadmium telluride. This allows the fabrication of detectors operating in the photovoltaic rather than the photoconductive mode of detection.

The electrical properties of mercury cadmium telluride can be altered either by changing the stoichiometry or by foreign impurity doping. Although not a great deal is known about the properites of impurities in mercury cadmium telluride, it is generally assumed that interstitial mercury and cadmium produce N type conductivity, while mercury and cadmium vacancies as well as tellurium interstitials produce P type conductivity. In Applied Physics Letters 10, 241 (1967) C. Vérie and J. Ayas suggested the formation of PN junctions in mercury cadmium telluride by the adjustment of stoichiometry.

The formation of PN junctions by diffusion of foreign impurities into mercury cadmium telluride is complicated by two requirements. First, the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $In_2Te_3$, $TeI_2$ and $TeI_4$.

SUMMARY OF THE INVENTION

In the present invention PN junctions are formed in a P type body of mercury cadmium telluride by heating an indium body to form hot indium and depositing the hot indium on a surface of the P type body. The hot indium is believed to cause localized heating of the body which is sufficient for the formation of an alloy junction but insufficient for the complete displacement of mercury within the alloy junction.

DESCRIPTION OF THE DRAWING

The FIGURE shows the I-V characteristic of a mercury cadmium telluride alloy junction diode formed by the method of the present invention.

DESCRIPTION OF THE PREFERRED EMBODIMENTS

In one preferred embodiment of the present invention, a P type body of mercury cadmium telluride is first lapped and then polished and etched using, for example, $Br_2$-Alcohol as an etchant. Hot indium in the form of liquid is deposited on the surface of the P type body. In one successful method, this is achieved by melting indium solder with a soldering iron by heating the solder to a temperature of about 150°C. The liquid indium is then deposited on a surface of the P type body. Electrical contact is made to the indium layer using a conductive epoxy, indium solder, silver paste, or thermocompression bonded gold wires. Electrical contact to the P type body is made by depositing a gold layer to which a wire is attached using an indium solder.

In another embodiment of the present invention, the electrical contact to the P type body is formed by depositing a gold layer on the P type body in the region where electrical contact to the P type body is to be made prior to deposition of the indium layer. The gold layer and the P type body are then heated to form a diffused region in the P type body which has diffused gold impurities therein. The preferred diffusion temperature is about 300°C. The diffusion of gold impurities into mercury cadmium telluride is further discussed in U.S. Pat. No. 3,743,553 by M. Walter Scott and Arvid E. Kloek entitled "PN Junctions in Mercury Cadmium Telluride", which is assigned to the same assignee of the present invention.

In the FIGURE is shown the I-V characteristic of a mercury cadmium telluride diode formed by the method of the present invention. The composition of the mercury cadmium telluride corresponded to an X value of about 0.6. The I-V characteristic was measured at a temperature of about 300°K.

In the present invention, it is necessary to subject the P type body and the indium layer to a temperature which is sufficient to cause formation of an alloy junction, and yet is insufficient to cause complete displacement of mercury within the alloy junction. In the preferred embodiment the alloy junction is formed by localized heating of the P type body by the hot indium while the body is maintained at room temperature, which is about 27°C.

It has been found that indium has a very high solubility in mercury cadmium telluride even at relatively low temperatures. Therefore, there is a tendency of indium to completely displace mercury with a resultant indium-cadmium-tellurium alloy remaining. As described previously, this tendency to replace mercury in the lattice is due to the small dissociation energy of mercury telluride.

The high solubility of indium in mercury cadmium telluride was discovered during the attempted fabrication of indium alloy junctions. A pellet of indium-0.005% gallium was placed in contact with a P type mercury cadmium telluride body. The pellet and the P type body were then heated in an $N_2$ atmosphere in an attempt to form an alloy junction. Temperatures between 170°C and 300°C and alloying times between one minute and ten minutes were used.

In all cases the junctions formed were of very poor quality. First, the indium did not wet the mercury cadmium telluride surface over the entire area of the pellet. This was particularly noticeable in the junctions formed at the lower temperatures of the range. In these devices the alloyed region showed only isolated regions of penetration into the P type body. The composition of the regions were measured by an electron beam microprobe. This indicated that even at temperatures as low as 170°C mercury was almost completely displaced from the lattice by indium. It is believed that indium formed the compound $In_2Te_3$ rather than simply doping the mercury cadmium telluride.

On the basis of these experiments, it can be seen that indium has too great a solubility in mercury cadmium telluride even at temperatures as low as 170°C to simply dope the crystal N type. Instead indium causes a complete displacement of mercury in the region of the alloy junction. Therefore, in the present invention the alloying of indium in mercury cadmium telluride to cause the formation of an alloy junction must be at a temperature insufficient to cause complete displacement of mercury. It can be seen this temperature must be substantially less than 170°C. In the present invention it has been found that good quality alloy junctions are formed when the P type body is maintained at room temperature and the hot indium which is deposited provides the necessary localized heating for formation of the alloy junction. Due to the convenience of forming junctions at room temperature, this comprises the preferred embodiment of the present invention. However, it is to be understood that formation of suitable alloy junctions can take place while maintaining the P type body at a temperature somewhat different from room temperature.

While this invention has been disclosed with particular reference to the preferred embodiments, it will be understood by those skilled in the art that changes in form and details may be made without departing from spirit and scope of the invention.

We claim:

1. A method of forming an infrared sensitive photodiode comprising:

heating an indium body to form liquid indium, maintaining a P type body of mercury cadmium telluride at a temperature substantially less than 170°C, and depositing the liquid indium on a surface of the P type body of mercury cadmium telluride to form an indium layer and a rectifying, photodetecting junction proximate the interface of the P type body and the indium layer.

2. The method of claim 1 wherein the P type body is maintained at a temperature of about 27°C.

3. The method of claim 1 and further comprising: making electrical contact to the indium layer.

4. The method of claim 1 and further comprising: making electrical contact to the P type body.

5. The method of claim 4 wherein making the electrical contact to the P type body comprises depositing a gold layer on the P type body.

6. The method of claim 5 wherein the gold layer is deposited in the region where electrical contact is to be made prior to depositing the indium layer, and wherein the body and the gold layer are heated to form a diffused region within the body adjacent the gold layer, the diffused region having diffused gold impurities therein.

* * * * *